(12) United States Patent
Oh et al.

(10) Patent No.: US 11,114,174 B2
(45) Date of Patent: Sep. 7, 2021

(54) MEMORY SYSTEM PROCESSING REQUEST BASED ON INFERENCE AND OPERATING METHOD OF THE SAME

(71) Applicant: Samsung Electronics Co., Ltd., Suwon-si (KR)

(72) Inventors: Hyunkyo Oh, Yongin-si (KR); Jinbaek Song, Hwaseong-si (KR); Kangho Roh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/819,374

(22) Filed: Mar. 16, 2020

(65) Prior Publication Data

US 2021/0050067 A1 Feb. 18, 2021

(30) Foreign Application Priority Data

Aug. 16, 2019 (KR) .................. 10-2019-0100539

(51) Int. Cl.
*G11C 16/34* (2006.01)
*G11C 16/26* (2006.01)
*G06N 3/04* (2006.01)
*G06K 9/62* (2006.01)
*G11C 16/16* (2006.01)

(52) U.S. Cl.
CPC ........ *G11C 16/3495* (2013.01); *G06K 9/6256* (2013.01); *G06N 3/0454* (2013.01); *G11C 16/16* (2013.01); *G11C 16/26* (2013.01)

(58) Field of Classification Search
CPC ..... G11C 16/3495; G11C 16/26; G11C 16/16; G06N 3/0454; G06K 9/6256
See application file for complete search history.

(56) References Cited

U.S. PATENT DOCUMENTS

| | | | |
|---|---|---|---|
| 7,679,133 B2 | 3/2010 | Son et al. | |
| 8,010,738 B1 | 8/2011 | Chilton et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,984,210 B2 | 3/2015 | Ryan et al. | |
| 9,336,483 B1 | 5/2016 | Abeysooriya et al. | |
| 10,013,211 B2 | 7/2018 | Lee et al. | |
| 10,216,422 B2 | 2/2019 | Kim et al. | |
| 10,643,730 B1* | 5/2020 | Steiner | G11C 29/021 |
| 2010/0246266 A1* | 9/2010 | Park | G11C 16/3495 365/185.11 |
| 2011/0233648 A1 | 9/2011 | Seol et al. | |
| 2017/0068478 A1 | 3/2017 | Nakatsuka et al. | |
| 2017/0222986 A1 | 8/2017 | Trachtenberg et al. | |
| 2018/0108422 A1* | 4/2018 | Oh | G11C 29/028 |
| 2019/0108888 A1 | 4/2019 | Sarkar et al. | |
| 2019/0391746 A1* | 12/2019 | Papandreou | G06F 3/0665 |

* cited by examiner

*Primary Examiner* — Ajay Ojha
(74) *Attorney, Agent, or Firm* — Harness, Dickey & Pierce, P.L.C.

(57) ABSTRACT

A memory system includes a memory device including a plurality of blocks, a buffer storing degradation information regarding at least one of the plurality of blocks, and a memory controller configured to determine a degradation level of the block corresponding to the read request based on the degradation information, in response to a read request from a host, infer a read level corresponding to the read request based on the degradation level, and read data from the memory device based on the read level.

19 Claims, 18 Drawing Sheets

FIG. 10

| BLK | Degradation information |
|---|---|
| BLK1 | V1(OCC1, OCC2, P/E Cycle, READ Count ⋯, Retention Time) |
| BLK2 | - |
| ⋯ | ... |
| BLKn | Vn(OCC1, OCC2, P/E Cycle, READ Count ⋯, Retention Time) |

FIG. 13

| BLK | Degradation Level | Degradation information |
|---|---|---|
| BLK1 | 4 | V1(OCC1, OCC2, P/E Cycle, READ Count ···, Retention Time) |
| BLK2 | 1 | V2(OCC1, OCC2, P/E Cycle, READ Count ···, Retention Time) |
| ... | ... | ... |
| BLKn | 8 | Vn(OCC1, OCC2, P/E Cycle, READ Count ···, Retention Time) |

MEMORY SYSTEM PROCESSING REQUEST BASED ON INFERENCE AND OPERATING METHOD OF THE SAME

CROSS-REFERENCE TO RELATED APPLICATION

This application claims the benefit of Korean Patent Application No. 10-2019-0100539, filed on Aug. 16, 2019, in the Korean Intellectual Property Office, the disclosure of which is incorporated herein in its entirety by reference.

BACKGROUND

One or more embodiments of the inventive concepts relate to a memory system, and more particularly, to a memory system inferring a read level based on degradation information regarding a block corresponding to a read request and an operating method of the same.

A memory system may include a memory controller and a memory device. As a type of memory device, a non-volatile memory device may include a plurality of memory cells storing data in a non-volatile manner. As a non-volatile memory, a flash memory may store data by modifying threshold voltages of the memory cells and read data by using a predetermined read level. However, the memory cells may be degraded due to a variety of reasons and a read error may occur due to the threshold voltages changed by the degradation of the memory cells.

SUMMARY

One or more embodiments of the inventive concepts provide a memory system with increased reliability and efficiency by reading data using a read level inferred based on degradation information regarding a block corresponding to a read request and an operating method of the same.

According to an aspect of the inventive concepts, a memory system includes a memory device including at least one block, a buffer configured to store degradation information regarding the at least one of the plurality of blocks, and a memory controller configured to infer a read level based on the degradation information of the at least one block corresponding to a read request from a host for the at least one block, and read data from the memory device based on the read level.

According to another aspect of the inventive concepts, a memory system includes a memory device including a plurality of blocks, a buffer storing degradation information regarding at least one block of the plurality of blocks, and a memory controller configured to read data from the at least on block in response to a read request from a host, wherein the memory controller may include a hardware accelerator executing an artificial intelligence model trained to infer a read level, and a processor configured to control the buffer to provide the hardware accelerator with degradation information regarding the at least one block corresponding to the read request, obtain, through the artificial intelligence model, a read level corresponding to the read request, and read data based on the obtained read level.

According to another aspect of the inventive concepts, a method of operating a memory system including a memory device including a plurality of blocks, the method includes receiving a read request from a host, obtaining degradation information regarding a block of the plurality of blocks corresponding to the read request, determining a degradation level of the block corresponding the read request based on the degradation information, inferring a read level corresponding to the read request based on the degradation level, and reading data from the memory device based on the read level.

BRIEF DESCRIPTION OF THE DRAWINGS

Embodiments of the inventive concepts will be more clearly understood from the following detailed description taken in conjunction with the accompanying drawings in which:

FIG. 10 is a diagram showing an example of degradation information according to the method of generating degradation information of FIG. 9;

FIG. 13 is a diagram showing an example of degradation information and degradation level information according to the method of generating degradation information and degradation level information of FIG. 12;

DETAILED DESCRIPTION OF THE EMBODIMENTS

Figure 1:
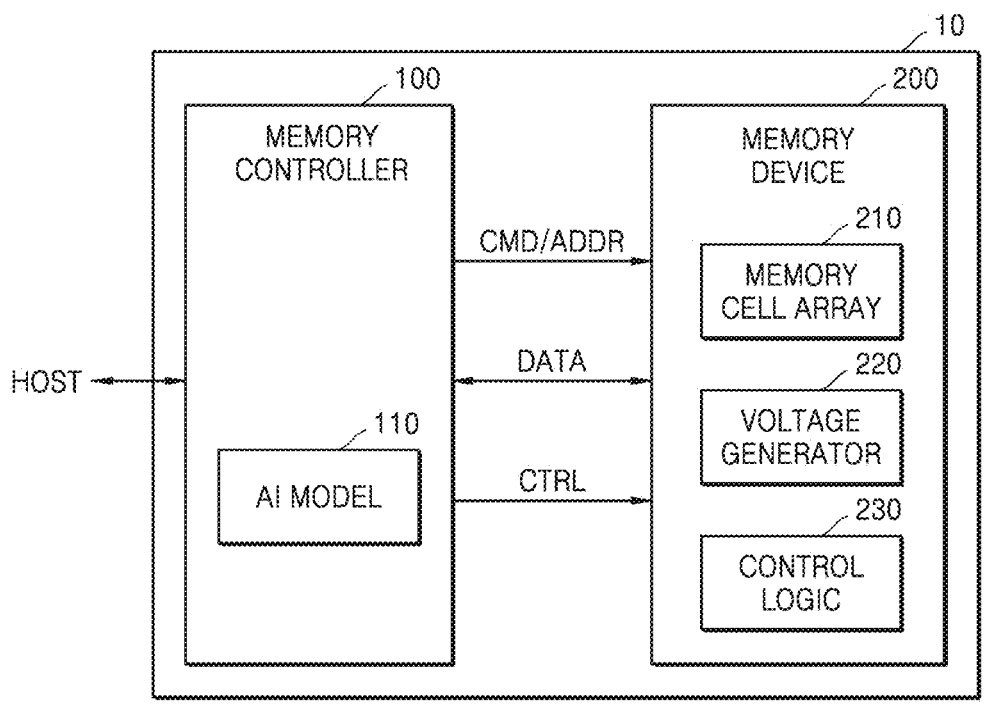
FIG. 1 is a block diagram illustrating a memory system, according to an embodiment of the inventive concepts.

FIG. 1 is a block diagram illustrating a memory system, according to an embodiment of the inventive concepts.

Referring to FIG. 1, a memory system 10 may include a memory controller 100 and a memory device 200, wherein the memory controller 100 may include an artificial intelligence model 110, and the memory device 200 may include a memory cell array 210, a voltage generator 220, and a control logic 230.

A host HOST may communicate with the memory system 10 through a variety of interfaces. For example, the host HOST may transmit a read request, a write request, and the like to the memory system 10. The host HOST may be implemented with an application processor (AP), a system-on-a-chip (SoC), or the like.

The memory system 10 may be implemented with a personal computer (PC), a data server, a network-attached storage (NAS), an Internet of things (IoT) device, a portable electronic device, or the like. Examples of the portable electronic device may include a laptop computer, a mobile phone, a smart phone, a tablet PC, a personal digital assistant (PDA), an enterprise digital assistant (EDA), a digital still camera, a digital video camera, an audio device, a portable multimedia player (PMP), a personal navigation device (PND), an MPEG-1 Audio Layer-3 (MP3) player, a handheld game console, an e-book, a wearable device, and the like.

Alternatively, the memory system 10 may be implemented with an internal memory embedded in an electronic device. For example, the memory system 10 may be a universal flash storage (UFS), an embedded multi-media card (eMMC), or a solid-state drive (SSD). Alternatively, the memory system 10 may be implemented with an external memory detachably attached to an electronic device. For example, the memory system 10 may be a UFS memory card, a compact flash (CF) card, a secure digital (SD) card, a micro secure digital (Micro-SD) card, a mini secure digital (Mini-SD) card, an extreme digital (xD) card, or a memory stick.

The memory controller 100 may control the memory device 200 to write (or program) data to the memory device 200, or read or erase the data stored in the memory device 200, in response to a read/write request from the host HOST.

In detail, the memory controller 100 may control write, read, or erase operations of the memory device 200 by providing the memory device 200 with an address ADDR, a command CMD, or a control signal CTRL. In addition, data DATA to be written to the memory device 200 and the data DATA read from the memory device 200 may be transmitted and received between the memory controller 100 and the memory device 200.

The memory device 200 may include a non-volatile memory device. The memory cell array 210 may include a plurality of memory cells, wherein the plurality of memory cells may include flash memory cells. However, embodiments of the inventive concepts are not limited thereto. The plurality of memory cells included in the memory cell array 210 may include resistive memory cells like resistive random access memory (ReRAM), phase change random access memory (PRAM), or magnetic random access memory (MRAM).

The memory cell array 210 may include a plurality of blocks. Each of the plurality of blocks may include a plurality of pages, wherein each of the pages may include a plurality of memory cells. Data erase operations may be performed in units of blocks, and data read and write operations may be performed in units of pages in the memory cell array 210. For example, the memory device 200 may perform erase operations in units of blocks, and read and write operations in units of pages with reference to the address ADDR from the memory controller 100.

The voltage generator 220 may generate various types of voltages for performing the read/write/erase operations. For example, a data write operation may be performed by using an incremental step pulse program (ISPP), and the voltage generator 220 may generate a plurality of voltages used for the ISPP and provide the memory cell array 210 with the generated plurality of voltages. In addition, the voltage generator 220 may generate a read voltage used in a read operation and provide the memory cell array 210 with the generated read voltage. Moreover, the voltage generator 220 may generate an erase voltage having a high voltage level used in an erase operation and provide the memory cell array 210 with the generated erase voltage.

The control logic 230 may control the overall operations associated with memory operations of the memory device 200. For example, the control logic 230 may control the voltage generator 220, wherein the voltage generator 220 may modify levels of the various types of voltages generated under the control of the control logic 230. Threshold voltage distribution of the memory cells of the memory cell array 210 may be adjusted according to the voltages generated by the voltage generator 220.

However, degradation (e.g., a threshold voltage change) may occur in the plurality of memory cells of the memory cell array 210. Degradation may occur due to retention, floating gate coupling, charge loss due to the elapsed time, or the like.

A read error may occur when the memory system 10 uses a default read level and attempts to read data once at a threshold voltage if the threshold voltage has changed due to the degradation of the plurality of memory cells. The read error may refer to a case where the number of error bits of the read data is equal to or greater than a reference number of errors that are able to be corrected by an error correction code (ECC). The read error may be referred to as an uncorrectable ECC (UECC).

Modification of a read level through a read retry operation may be required to remove the read error. The memory system 10 may execute a recovery code in order to perform the read retry operation, and a substantial period of time may be required in executing the recovery code. If data is read using a default read level when the memory cells have degraded, the memory system 10 may have reduced reliability of the data due to the read error and performance degradation due to the read retry operation.

According to an example embodiment of the inventive concepts, the memory controller 100 may infer a read level based on the degradation information regarding the plurality of blocks of the memory device 200 in response to a read request from the host HOST and read data from the memory device 200 based on the inferred read level, in order to prevent the reliability of the data and its performance from being undermined due to the degradation. The degradation information may include a variety of information related to the degradation state of the plurality of blocks included in the memory cell array 210.

In an example embodiment of the inventive concepts, the memory controller 100 may anticipate a degradation state of the block corresponding to the read request based on the degradation information regarding the plurality of blocks and infer a read level capable of reading data without making any read error even in the anticipated degradation state. In addition, the memory controller 100 may read the data by providing the memory device 200 with the information regarding the inferred read level through the command CMD and/or the control signal CTRL. Thus, the memory system 10 according to an example embodiment of the inventive concepts may reduce read errors made in the read data, increase the reliability of the data, and improve its performance by not incurring any overhead of operations involved in a read retry.

According to an example embodiment of the inventive concepts, the memory controller 100 may include the artificial intelligence model 110 trained to infer read levels. The memory controller 100 may perform the afore-described operation of inferring a read level, using the artificial intelligence model 110. In detail, the memory controller 100 may obtain the read level corresponding to the read request by providing the artificial intelligence model 110 with the degradation information.

The artificial intelligence model 110 may be implemented with software or hardware and be a model based on at least one of an artificial neural network (ANN) model, a multi-layer perceptrons (MLPs) model, a convolutional neural network (CNN) model, a deconvolutional neural network, a decision tree model, a random forest model, an Adaboost (adaptive boosting) model, a multiple regression analysis model, a logistic regression model, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM). Alternatively or additionally, the artificial intelligence model 110 may include other forms of artificial intelligence models, such as, for example, linear and/or logistic regression, statistical clustering, Bayesian classification, decision trees, dimensionality reduction such as principal component analysis, and expert systems a random sample consensus (RANSAC) model; and/or combinations thereof. Examples of the artificial intelligence model 110 are not limited thereto.

Additionally, according to an example embodiment of the inventive concepts, the memory controller 100 may optionally perform the operation of inferring a read level according to a degradation level of the block corresponding to the read request. In detail, the memory controller 100 may determine a degradation level representing the degree of the degradation that has occurred, based on the degradation information regarding the block corresponding to the read request and determine whether to infer a read level or not based on the determined degradation level.

For example, when the read level of the block corresponding to the read request is equal to or greater than a predefined threshold value, the memory controller 100 anticipates that the threshold voltage distribution change due to the degradation is substantial, and accordingly, may infer a read level corresponding to the read request. In contrast, when the read level of the block corresponding to the read request is less than the threshold value, the memory controller 100 anticipates that the threshold voltage distribution change due to the degradation is slight. In that case, the memory controller 100 may read the data based on the default read level without inferring a read level. Alternatively, separate firmware or software, executed by a processing unit stored in the memory controller 100, may perform the afore-described operations of determining a degradation level and whether to infer a read level or not based on the determined degradation level.

In an example embodiment of the inventive concepts, the memory controller 100 may reduce the overhead of calculating involved in an inferring operation while increasing the reliability of the data and reducing the read retry operation by inferring a read level only when anticipating that the threshold voltage distribution will be substantial.

Figure 2:
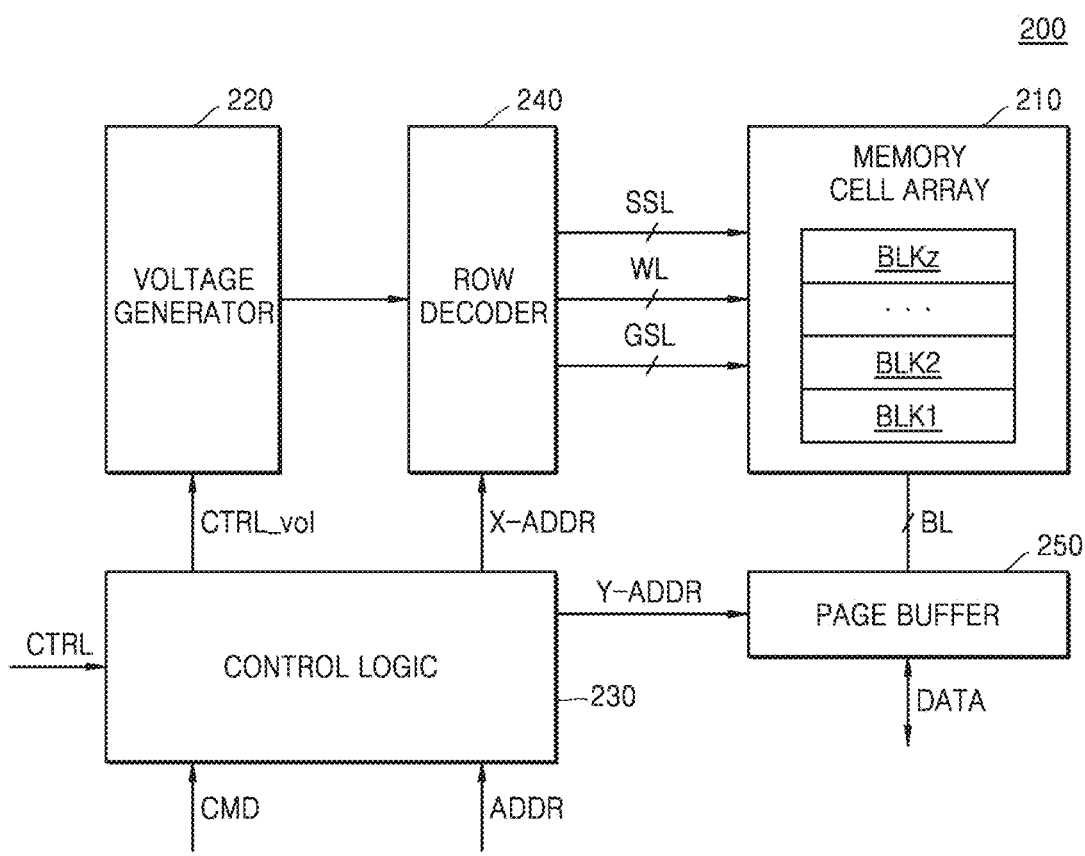
FIG. 2 is a block diagram illustrating an implementation of a memory device of FIG. 1, according to an embodiment of the inventive concepts.

FIG. 2 is a block diagram illustrating an implementation of a memory device of FIG. 1, according to an example embodiment of the inventive concepts.

Referring to FIG. 2, a memory device 200 may include the memory cell array 210, the voltage generator 220, the control logic 230, a row decoder 240, and a page buffer 250. Though not shown in FIG. 2, the memory device 200 may further include other various components associated with memory operations like a data input/output circuit, an input/output interface, or the like.

The memory cell array 210 includes a plurality of blocks BLK1 through BLKz, wherein memory cells of the blocks BLK1 through BLKz may be connected to word lines WL, string select lines SSL, ground select lines GSL, and bit lines BL. The memory cell array 210 is connected to the row decoder 240 through the word lines WL, the string select lines SS, and the ground select lines GSL, and may be connected to the page buffer 250 through the bit lines BL. Each of the memory cells may store one or more bits. For example, each memory cell may include a multi-level cell (MLC), a triple level cell (TLC), or a quad level cell (QLC).

The memory cell array 210 may include a two-dimensional memory cell array, wherein the two-dimensional memory cell array may include a plurality of cell strings arranged in row and column directions. In addition, according to an embodiment of the inventive concepts, the memory cell array 210 may include a three-dimensional memory cell array, wherein the three-dimensional memory cell array may include a plurality of cell strings, wherein each cell string may include the memory cells connected to each of the word lines vertically stacked on the substrate. For example, U.S. Pat. Nos. 7,679,133, 8,553,466, 8,654,587, and 8,559,235, and U.S. Patent Publication No. 2011/0233648 disclose possible configurations for a three dimensional memory cell array formed of a plurality of levels, in which word lines and/or bit lines are shared among levels. U.S. Pat. Nos. 7,679,133, 8,553,466, 8,654,587, and 8,559,235 and U.S. Patent Publication No. 2011/0233648 are incorporated herein by reference.

The control logic 230 may output various types of internal control signals for programming data in the memory cell array 210 or reading data from the memory cell array 210, based on the command CMD, the address ADDR, or the control signal CTRL received from the memory controller 100. For example, the control logic 230 may output a voltage control signal CTRL_vol for controlling levels of the various types of voltages generated in the voltage generator 220, provide the row decoder 240 with a row address X-ADDR, and provide the page buffer 250 with a column address Y-ADDR. The voltage generator 220 may generate the various types of voltages used in the memory device 200. As an example, the voltage generator 220 may generate a program voltage and a verify voltage used in a write operation, and a read voltage used in a read operation.

According to an example embodiment of the inventive concepts, concerning the operation of inferring a read level, the memory controller 100 may transmit the information regarding the inferred read level through the command CMD and/or the control signal CTRL. The control logic 230 may generate the voltage control signal CTRL_vol based on the information regarding the verified read level through the received command CMD and/or the control signal CTRL. The voltage generator 220 may generate a read voltage Vrd corresponding to inferred the read level in response to the voltage control signal CTRL_vol.

Figure 3A:
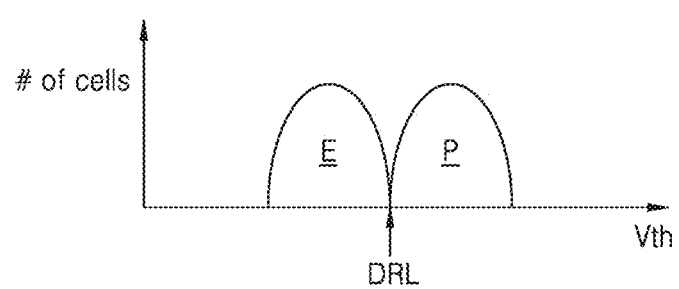
FIGS. 3A and 3B are diagrams showing an example of a threshold voltage distribution variation due to the degradation of memory cells.
Figure 3B:
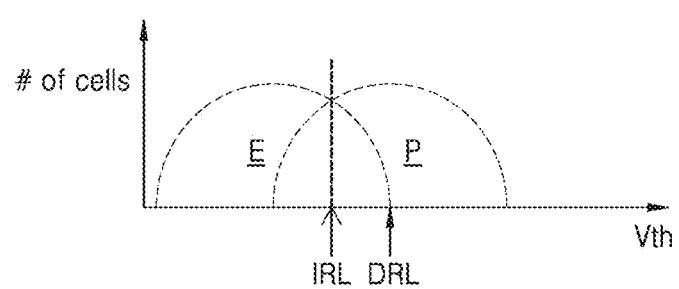

FIGS. 3A and 3B are diagrams showing an example of a threshold voltage distribution variation due to degradation of memory cells.

Referring to FIGS. 3A and 3B, the horizontal axis refers to a threshold voltage Vth and the vertical axis refers to the number of the memory cells. Referring to FIG. 3A, when a memory cell is a single level cell programmed with 1 bit, the memory cell may have either of an erase state E and a program state P. In addition, the memory cell may have a threshold voltage distribution corresponding to the erase state E or the program state P. The memory system 10 may use a default read level DRL to determine the erase state E or the program state P of the memory cell.

On the other hand, when the memory cell degrades, the threshold voltage distribution may change. Referring to FIG. 3B, it may be identified that the threshold voltage distribution corresponding to the erase state E or the program state P of the memory cell has changed. The threshold voltage distribution of the memory cells may vary when the threshold voltage decreases due to the voltage stored in a charge storage layer of the memory cell being leaked onto the substrate or when the threshold voltage increases due to a read disturb by a read operation being performed on an adjacent memory cell. In addition, the threshold voltage distribution of the memory cell may vary due to an increase in the frequency of program/erase operations on the memory cell or a change in the operating temperature of the memory cell.

When the threshold voltage distribution has changed and if the memory system 10 reads data using the default read level DRL in order to determine the erase state E or the program state P of the memory cell, a read error may occur in some of the memory cells programmed in the program state P. In that case, modification of the read level may be required through a read retry operation.

However, according to an example embodiment of the inventive concepts, the memory system 10 may anticipate a degradation state of the block corresponding to the read request based on the degradation information in response to a read request from the host HOST and infer a read level capable of making no read errors based on the anticipated degradation state. In addition, the memory system 10 may use an inferred read level IRL in order to determine the erase state E or the program state P of the memory cell. Consequently, the memory system 10 may increase the reliability of the read data and improve its performance by not incurring any overhead of operations involved in a read retry.

Figure 4A:
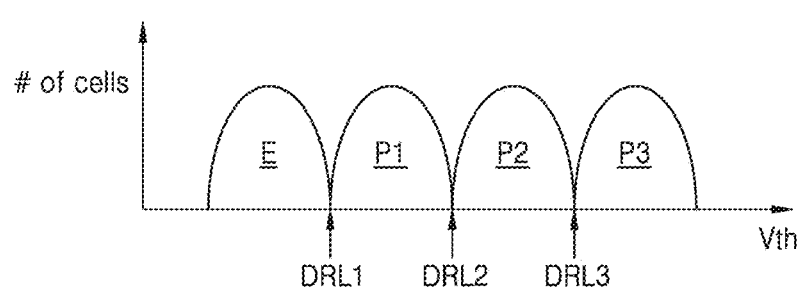
FIGS. 4A and 4B are diagrams showing another example of a threshold voltage distribution variation due to the degradation of memory cells.
Figure 4B:
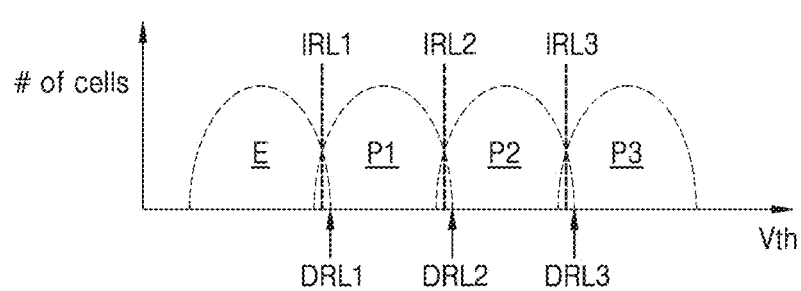

FIGS. 4A and 4B are diagrams showing another example of a threshold voltage distribution variation due to degradation of memory cells.

Referring to FIGS. 4A and 4B, the horizontal axis refers to the threshold voltage Vth and the vertical axis refers to the number of the memory cells. Referring to FIG. 4A, when a memory cell is a multi-level cell programmed with 2 bits, the memory cell may have one of the erase state E and a first through third program states P1 through P3. The memory cell may have threshold voltage distribution corresponding to the erase state E or the first through third program states P1 through P3. The memory system 10 may use each of a first through third default read levels DRL1 through DRL3 in order to determine the first through third program states P1 through P3 of the memory cell.

On the other hand, when the memory cell degrades, the threshold voltage distribution of the memory cell may change. Referring to FIG. 4B, it may be identified that the threshold voltage distribution corresponding to the erase state E or the first to third program states P1 to P3 of the memory cell has changed. In that case, if the memory system 10 reads data using the default read levels DRL1 through DRL3 as they are in order to determine the erase state E or the first through third program states P1 through P3 of the memory cell, a read error may occur in some of the memory cells programmed in the first through third program states P1 through P3. In that case, modification of the read level through a read retry operation may be required.

However, according to an example embodiment of the inventive concepts, the memory system 10 may anticipate a degradation state of the block corresponding to the read request based on the degradation information, in response to a read request from the host HOST and infer a read level capable of making no read errors based on the anticipated degradation state. In addition, the memory system 10 may use the inferred read levels IRL1 through IRL3 in order to determine the erase state E or the first to third program states P1 through P3 of the memory cell. Consequently, the memory system 10 may increase the reliability of the read data and improve its performance by not incurring any overhead of operations involved in a read retry.

Though not shown in FIGS. 3A through 4B, the same principle may be applied to the case where the memory cell is a larger level cell, for example a triple level cell or a quad level cell.

Figure 5:
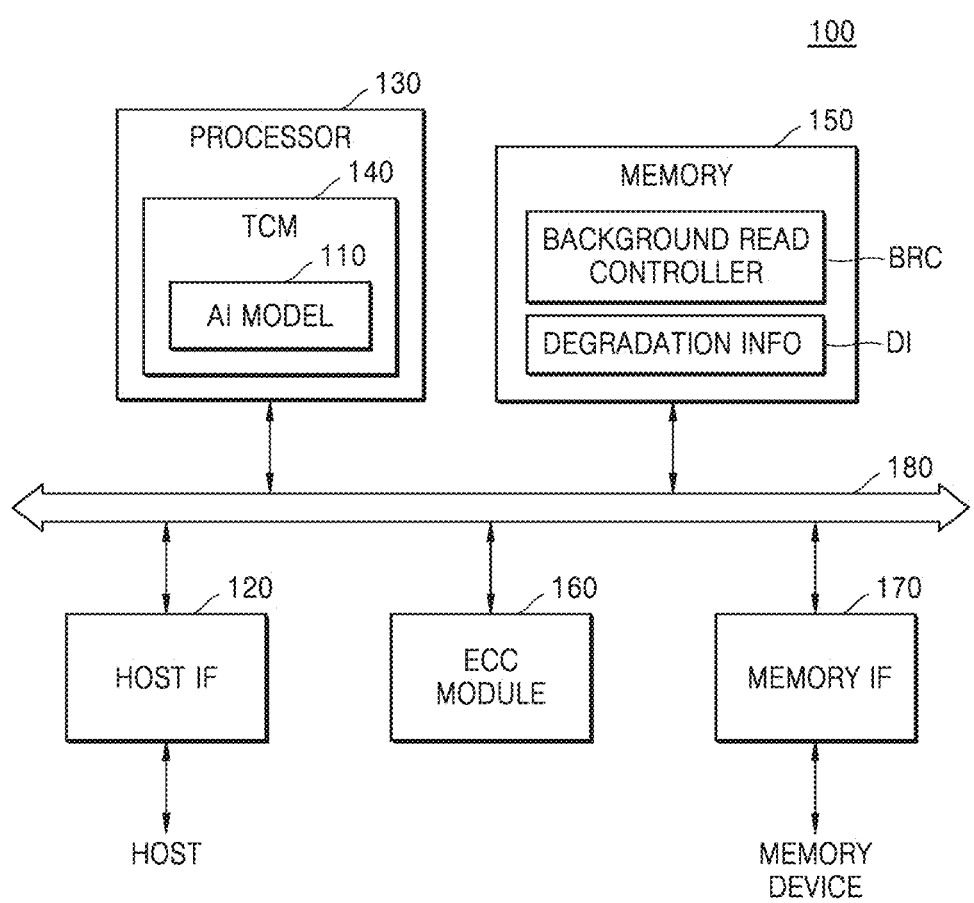
FIG. 5 is a block diagram illustrating a memory controller of FIG. 1, according to an embodiment of the inventive concepts.

FIG. 5 is a block diagram illustrating a memory controller of FIG. 1, according to an example embodiment of the inventive concepts.

Referring to FIG. 5, the memory controller 100 may include a host interface 120, a processor 130, a tightly coupled memory (TCM) 140, a memory 150, an error correction code (ECC) module 160, and a memory interface 170, and the elements may communicate with one another via a bus 180.

The host interface 120 may provide a physical connection between the host HOST and the memory system 10. As an example, the host interface 120 may include a variety of interface methods like advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), a secure digital (SD) card, a multi-media card (MMC), an embedded multi-media card (eMMC), a compact flash (CF) card interface, and the like.

The host interface 120 may receive a read request from the host HOST and transmit the data read from the memory device 200 to the host HOST.

The processor 130 may be processing circuitry such as hardware including logic circuits; a hardware/software combination executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc. The processor 130 may control the overall operations of the memory controller 100 by executing instructions stored in the memory 150. For example, the processor 130 may determine a degradation level using the degradation information regarding the block corresponding to the read request and execute firmware or software that performs an operation of determining whether to infer a read level or not based on the determined degradation level. In addition, the processor 130 may include the TCM 140 in which the artificial intelligence model trained to infer read levels is stored. Moreover, since the processor 130 may access the TCM 140 within a relatively short period of time, the processor 130 may quickly perform a read level inferring operation using the artificial intelligence model 110 when receiving a read request from the host HOST.

The memory 150 may be a data buffer, may operate under the control of the processor 130, and may be volatile memory like DRAM and SRAM or non-volatile memory like PRAM and flash memory. The memory 150 may be a memory block dedicated as a data buffer to the processor 130, or may be, for example, a block of the memory device dedicated as a buffer.

A background read controller BRC included in the memory 150 may control a background read operation on the plurality of blocks BLK1 through BLKn included in the memory device 200 by being executed by the processor 130. The background read operation may refer to an operation performed by the background read controller BRC that issues on its own a read command CMD and the address ADDR without receiving a read request from the host HOST and reads the data DATA from the memory device 200, in response to the read command CMD and the address ADDR. The background read controller BRC may be implemented with firmware or software and loaded to the memory 150. However, embodiments of the inventive concepts are not limited thereto. Alternatively, the background read controller BRC may be implemented with hardware.

The memory controller 100 may collect degradation information DI regarding each of the plurality of blocks following the background read operation. Following this, the memory controller 100 may store the collected degradation information DI in the memory 150.

The degradation information DI may include at least one of a program/erase cycle (P/E Cycle), a read count, retention time, operating temperature, and the number of error bits of the read data.

Additionally, the degradation information DI may include the afore-described information regarding each word line or each memory cell included in each block.

Moreover, the degradation information DI may include an on cell count (e.g., the number of memory cells that turn on when a default read level is applied to each word line of the blocks) and/or an off cell count (e.g., the number of memory cells that turn off when the default read level is applied to each word line of the blocks under the control of the background read controller BRC). However, the types of the degradation information DI are not limited thereto.

The memory controller 100 may perform the background read operation and the degradation information DI collecting operation at a preset cycle. However, embodiments of the inventive concepts are not limited thereto. Alternatively, the memory controller 100 may perform the background read operation and the degradation information DI collecting operation according to a variable cycle.

The artificial intelligence model 110 may be provided with the collected degradation information DI under the control of the processor 130, and accordingly, a read level inferring operation may be performed. A read level inferring operation will be described in greater detail hereinafter.

When receiving a read request from the host HOST, the processor 130 may obtain degradation information regarding the block corresponding to the read request from the degradation information DI stored in the memory 150. Once the processor 130 has received a read request and a logic address from the host HOST, the processor 130 may obtain a physical address corresponding to the logic address and obtain degradation information regarding the block corresponding to the physical address of the plurality of blocks of the memory device 200. On the other hand, the memory 150 may store a mapping table (not shown) that maps logic addresses and physical addresses.

In addition, the processor 130 may determine a degradation level of the block corresponding to the read request based on the obtained degradation information. When the determined degradation level is equal to or greater than a threshold value, the processor 130 may control the memory 150 to provide the TCM 140 with the verified degradation information. The degradation level may consist of three or more different levels depending on the degradation degree. The higher the degradation level, the greater may be the degradation degree. However, embodiments of the inventive concepts are not limited thereto. There are two kinds of degradation levels: Degradation level "0" refers to that degradation has not occurred or degradation is slight, and degradation level "1" refers to that degradation exists.

The degradation level determining operation may be performed based on a combination of the various sets of information included in the degradation information. For example, the degradation level may correspond to the value of the on cell count or the off cell count of the degradation information, and the processor 130 may determine the degradation level of the block by verifying the on cell count or the off cell count of the degradation information. Alternatively, the degradation level may be determined based on a combination of at least one or more of the P/E Cycle, the read count, the retention time, the operating temperature, the number of error bits of the read data, and the like included in the degradation information. Alternatively, the read level determining operation may be performed by a separate configuration other than the processor 130.

The processor 130 may execute the artificial intelligence model 110 included in the TCM 140 and obtain the read level inferred from the artificial intelligence model 110. In addition, the processor 130 may control the memory interface 170 to provide the memory device 200 with the information regarding the inferred read level through the command CMD and/or the control signal CTRL.

On the other hand, when the determined degradation level is less than a threshold value, the processor 130 may determine a default read level as the read level corresponding to the read request without inferring a read level corresponding to the read request. Additionally, the processor 130 may control the memory interface 170 to provide the memory device 200 with the information regarding the default read level through the command CMD and/or the control signal CTRL.

The ECC module 160 detects error bits from the data received from the memory device 200 and may perform an ECC operation correcting the detected error bits. The ECC module 160 may determine whether the number of the detected error bits from the received data exceeds the correction capability of the ECC module 160.

For example, the ECC module 160 detects the error bits from the read data in response to the read request from the host HOST and may determine whether the number of the detected error bits exceeds its error correction capability. If the number of the detected error bits exceeds its error correction capability, the ECC module 160 may notify the processor 130 of the resulting fact, wherein the processor 130 may execute the recovery code to perform a read retry operation.

The ECC module 160 may be implemented with hardware. However, embodiments of the inventive concepts are not limited thereto. Alternatively, the ECC module 160 may be implemented with firmware or software and loaded to the memory 150.

The memory interface 170 may provide a channel between the memory controller 100 and the memory device 200. For example, the command CMD, the address ADDR, the data DATA, the DI, and the like may be transmitted and received between the memory controller 100 and the memory device 200 through the memory interface 170. Data requested to be written from the host HOST and the data read from the memory device 200 may be temporarily stored in the memory 150.

Although a memory controller is illustrated and described as including one TCM in the illustration and description of FIG. 5, a memory controller may be implemented with a plurality of TCMs.

In addition, although a memory controller is illustrated and described as including one memory in the illustration and description of FIG. 5, a memory controller may include a plurality of memories. In that case, the background read controller BCR may be stored in one memory and the degradation information may be stored in the remaining memories.

Figure 6:
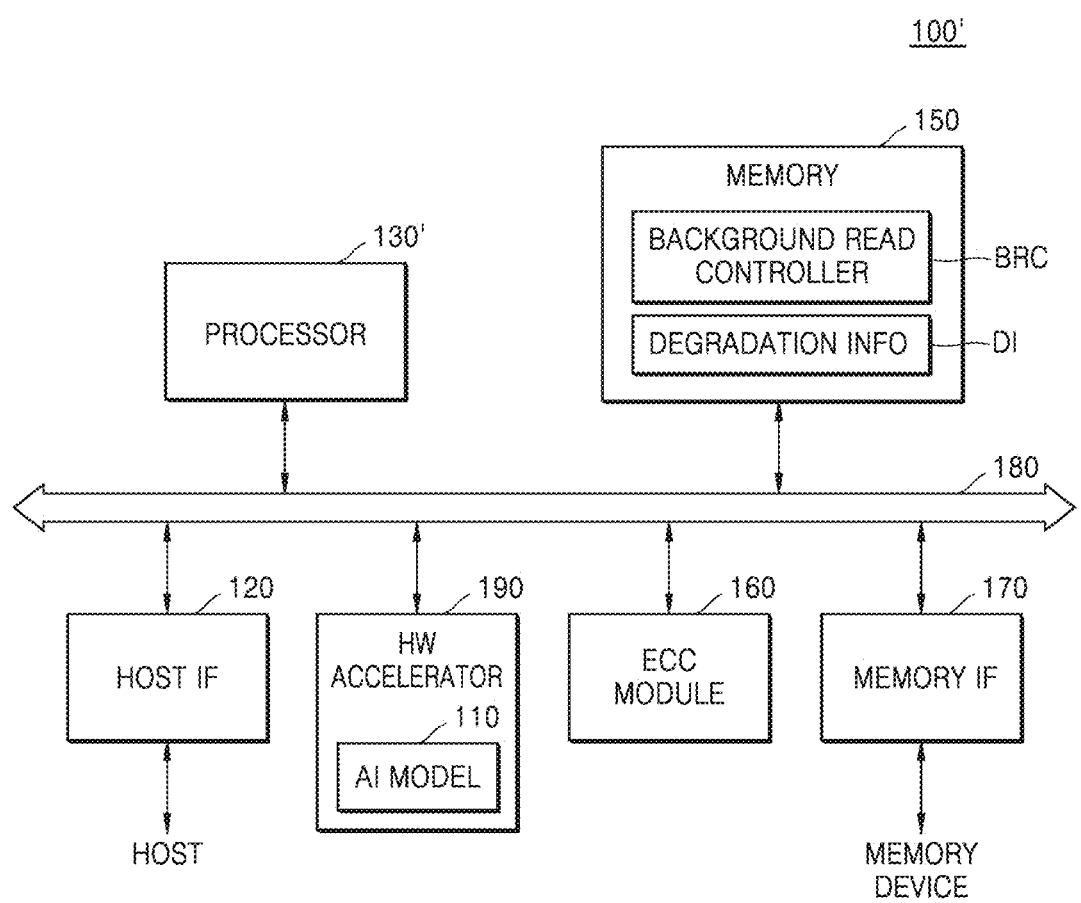
FIG. 6 is a block diagram illustrating the memory controller of FIG. 1, according to another embodiment of the inventive concepts.

FIG. 6 is a block diagram illustrating a memory controller of FIG. 1, according to another embodiment of inventive concepts.

Referring to FIG. 6, a memory controller 100' is a modified embodiment of the memory controller 100 illustrated in FIG. 5. Thus, descriptions that are the same as those of FIG. 5 will be omitted hereinafter. A hardware accelerator 190 may implement the artificial intelligence model 110 trained to infer read levels. The hardware accelerator 190 may include an artificial intelligence calculation-specific accelerator.

Examples of the hardware accelerator 190 may include various types of accelerators like a field-programmable gate array (FPGA), a massively parallel processor array (MPPA), a graphics processing unit (GPU), an application-specific integrated circuit (ASIC), a neural processing unit (NPU), a tensor processing Unit (TPU), a multi-processor system-on-chip (MPSoC), and the like. The processor 130 may perform a read level inferring operation using the hardware accelerator 190.

Once the processor 130' has received a read request from the host HOST, the processor 130 may identify degradation information regarding the block corresponding to the read request from the degradation information DI stored in the memory 150. Following this, the processor 130' may determine a degradation level of the block corresponding to the read request based on the identified degradation information. When the determined degradation level is equal to or greater than a threshold value, the processor 130' may control the memory 150 to provide the hardware accelerator 190 implementing the artificial intelligence model 110 with the identified degradation information.

In addition, the processor 130' may control the hardware accelerator 190 to execute the artificial intelligence model 110 and may obtain the read level inferred from the artificial intelligence model 110. Moreover, the processor 130' may control the memory interface 170 to provide the memory device 200 with the information regarding the inferred read level through the command CMD and/or the control signal CTRL.

On the other hand, when the determined read level is less than the threshold value, the processor 130' may determine a default read level as the read level corresponding to the read request without inferring a read level. Furthermore, the processor 130 may control the memory interface 170 to provide the memory device 200 with the information regarding the default read level through the command CMD and/or the control signal CTRL.

When the artificial intelligence model 110 executed by an artificial intelligence calculation-specific hardware like the hardware accelerator 190 is utilized, read level inferring operations may be quickly performed in parallel. In such a case, a read level may be inferred almost within the same period of time as when a read path needing no inferring processes is utilized, and thus, the resulting read level may be transmitted to the memory device 200.

Figure 7:
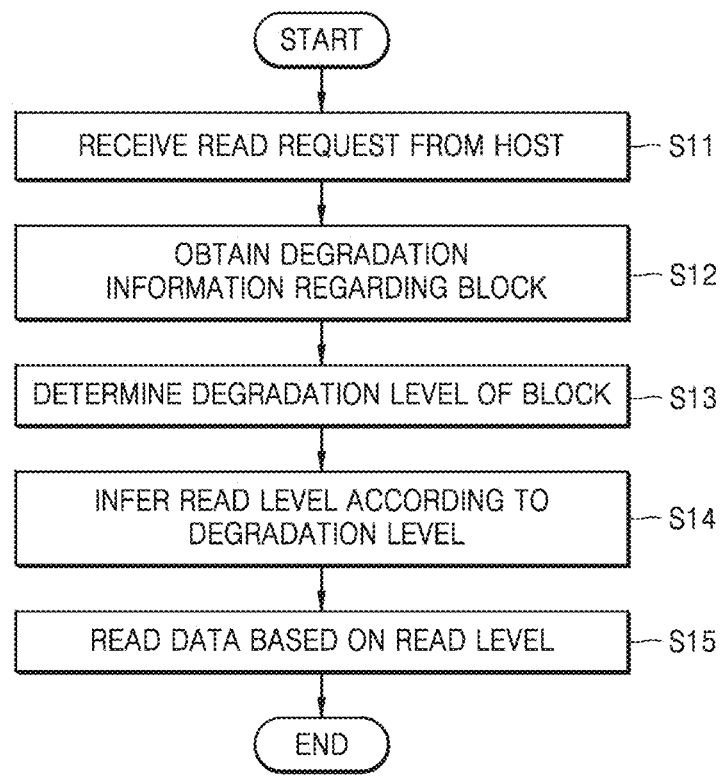
FIGS. 7 and 8 are flowcharts illustrating a method of operating a memory system, according to an embodiment of the inventive concepts.
Figure 8:
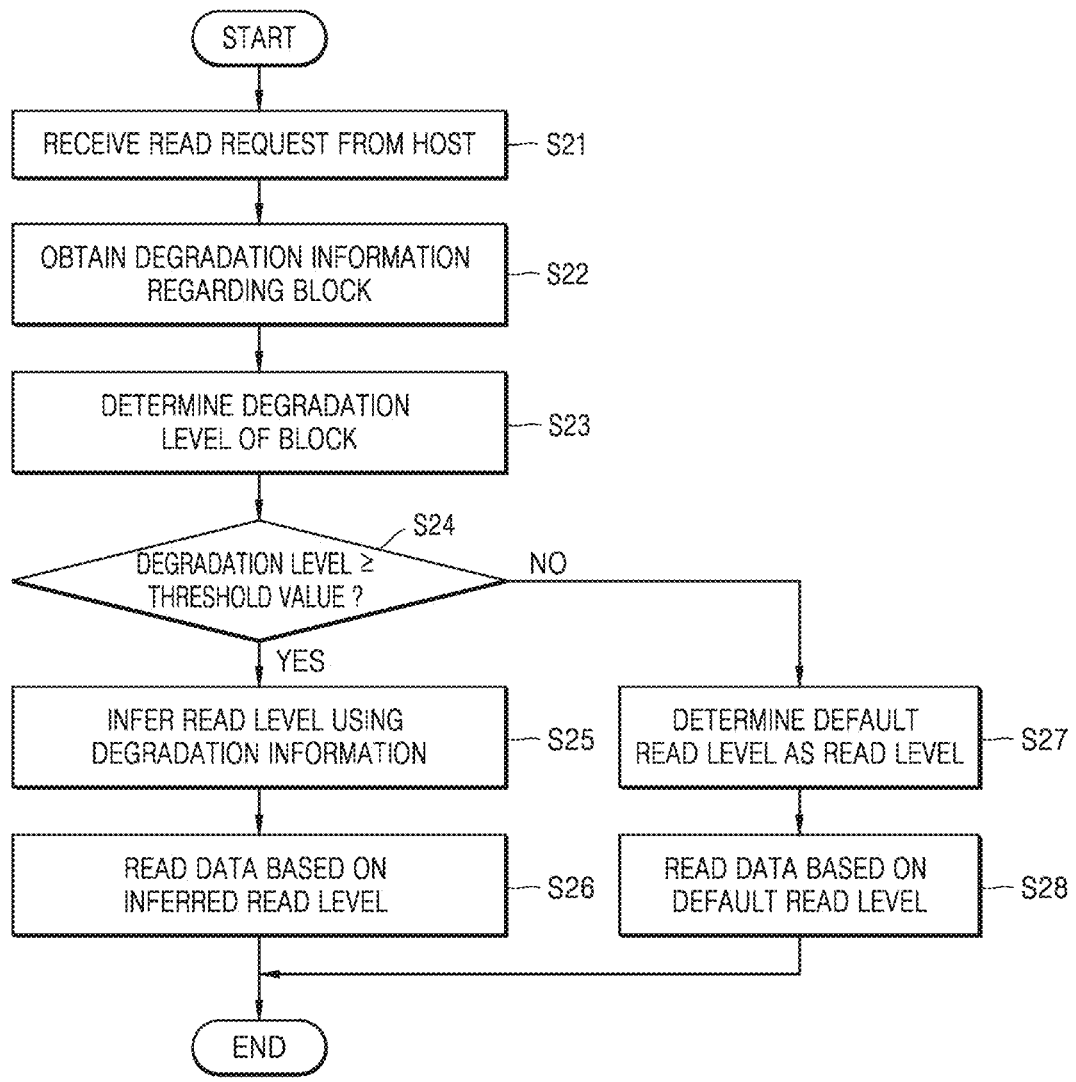

FIGS. 7 and 8 are flowcharts illustrating a method of operating a memory system, according to an embodiment of the inventive concepts.

FIG. 7 is a flowchart illustrating a read level inferring operation based on degradation information regarding a block corresponding to a read request, according to the present embodiment. For example, an operating method according to the present embodiment may be executed in the memory system 10 including the memory controller 100 of FIG. 5 or the memory system 10 including the memory controller 100' of FIG. 6. The descriptions with reference to FIGS. 1 through 6 may be applied to the present embodiment.

Referring to FIG. 7, read requests may be received from a host, in operation S11. The memory controllers 100 and 100' may receive a read request from the host through the host interface 120. The memory system 10 may further receive a logic address associated with the read request from the host.

Degradation information regarding the block may be obtained, in operation S12. The memory controllers 100 and 100' may obtain a physical address corresponding to the received logic address from the plurality of blocks of the memory device 200 and degradation information regarding the block corresponding to the physical address of the plurality of blocks. The degradation information may include at least one of an on cell count, an off cell count, a P/E Cycle, a read count, retention time, operating temperature, and the number of error bits of the read data.

A degradation level regarding the block may be determined, in operation S13. The memory controllers 100 and 100' may determine a degradation level based on the obtained degradation information. In detail, the memory controllers 100 and 100' may determine a degradation level of the block corresponding to the read request by verifying the degradation level corresponding to the value of the on cell count or the off cell included in the degradation information. Alternatively, the memory controller 100 and 100' may determine a degradation level based on a combination of at least one or more of the P/E Cycle, the read count, the retention time, the operating temperature, the number of error bits of the data read, and the like included in the degradation information.

A read level may be inferred based on the degradation level, in operation S14. The memory controllers 100 and 100' may infer a read level corresponding to the read request based on the determined degradation level. For example, the memory controllers 100 and 100' may or may not perform a read level inferring operation depending on whether the degradation level is equal to or greater than a threshold value. A detailed description thereon will be provided in the description and illustration of FIG. 8 hereinafter.

A read level inferring operation based on the degradation level may be executed in an inferring method selected according to the determined degradation level. For example, if there are a first method and a second method for inferring a read level, a read level may be inferred in the first method or the second method according on the degradation level.

The memory controllers 100 and 100' may infer a read level using the artificial intelligence model 110 trained to infer read levels. In detail, the memory controllers 100 and 100' may input the degradation information regarding the block corresponding to the read request to the artificial intelligence model 110 and obtain the read level inferred from the artificial intelligence model 110.

The artificial intelligence model 110 may be implemented with software or hardware and be a model based on at least one of a decision tree model, a random forest model, an AdaBoost model, a multi regression analysis model, a logistic regression model, and a random sample consensus (RANSAC) model, a model as discussed above, or a combination thereof. Examples of the artificial intelligence model 110 are not limited thereto.

Alternatively, the artificial intelligence model 110 may be executed in the TCM 140 included in the processor 130 of the memory controllers 100 and 100'. Additionally, the artificial intelligence model 110 may be implemented by the hardware accelerator 190 included in the memory system 10.

Data may be read based on the read level, in operation S15. The memory controllers 100 and 100' may transmit the information regarding the inferred read level to the memory device 200 through the command CMD and/or the control signal CTRL and receive the data read from the memory device 200.

FIG. 8 is a flowchart illustrating in detail a read level inferring operation based on a degradation level of a block corresponding to a read request, according to FIG. 7. Referring to FIG. 8, operations of receiving a read request from a host, obtaining degradation information regarding a block, and determining a read level of a block performed in operations S21 through S23 may be substantially identical with the afore-described operations in operations S11 through S13 with reference to FIG. 7. Thus, descriptions that are the same as those of FIG. 7 will be omitted hereinafter.

The degradation level of the block corresponding to the read request may be compared with a threshold value, in operation S24. If the degradation level is equal to or greater than the threshold value, the memory controllers 100 and 100' may perform operation S25 In contrast, if the degradation level is less than the threshold value, the memory controllers 100 and 100' may perform operation S27

A read level corresponding to the read request may be inferred using the degradation information regarding the block corresponding to the read request, in operation S25. Data may be read using the inferred read level, in operation S26.

A default read level may be determined as the read level corresponding to the read request, in operation S27. In detail, the memory controllers 100 and 100' may determine a default read level as the read level corresponding to the read request without performing a read level inferring operation. Data may be read using the default read level, in operation S28. The memory controllers 100 and 100' may transmit the information regarding the default read level to the memory device 200 through the command CMD and/or the control signal CTRL. The memory device 200 verifies the information regarding the inferred read level through the received command CMD and/or the control signal CTRL, thereby the memory device 200 may read the data using a read voltage corresponding to the inferred read level.

Figure 9:
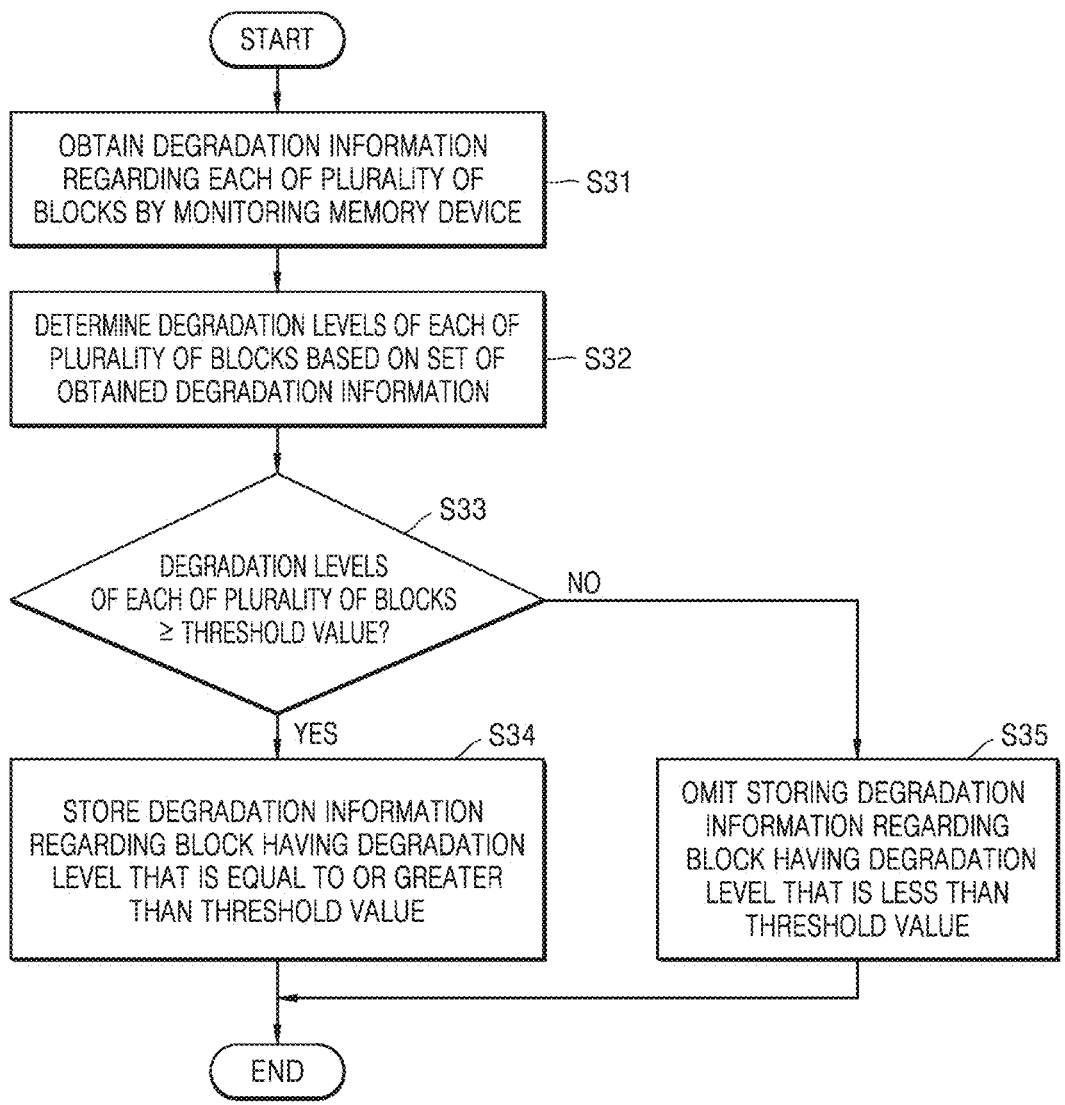
FIG. 9 is a flowchart illustrating a method of generating degradation information, according to an embodiment of the inventive concepts.

FIG. 9 is a flowchart illustrating a method of generating degradation information, according to an embodiment of the inventive concepts.

Referring to FIG. 9, the method of generating degradation information according to the present embodiment is the one executed through a background read operation. For example, the method of generating degradation information according to the present embodiment may be executed in the memory system 10 including the memory controller 100 of FIG. 5 or in the memory system 10 including the memory controller 100' of FIG. 6. The afore-described descriptions with reference to FIGS. 1 through 6 may be applied to the present embodiment.

Degradation information regarding each of the plurality of blocks may be collected by monitoring the memory device 200, in operation S31. The memory controllers 100 and 100' may perform a background read operation through the background read controller BCR when performing a background operation. In addition, the memory controllers 100 and 100' may collect degradation information regarding each of the plurality of blocks following the background read operation.

Degradation levels of each of the plurality of blocks may be determined based on the collected degradation information, in operation S32. Detailed methods of determining a degradation level may be substantially identical with the foregoing descriptions in connection with FIG. 5. Thus, descriptions that are the same as those of FIG. 5 will be omitted hereinafter.

The degradation levels of each of the plurality of blocks may be compared with a threshold value, in operation S33. The memory controllers 100 and 100' may execute operation S34 on the blocks whose degradation levels are equal to or greater than the threshold value. On the other hand, the memory controllers 100 and 100' may execute operation S35 on the blocks whose degradation levels are less than the threshold value. The memory controllers 100 and 100' may execute operations S34 and S35 in parallel.

The degradation information regarding the blocks whose degradation levels are equal to or greater than the threshold value of the plurality of blocks may be stored, in operation S34. In other words, the memory controllers 100 and 100' may store in the memory 150 solely the degradation information regarding the blocks whose degradation levels are equal to or greater than the threshold value.

On the other hand, operation of storing the degradation information regarding the blocks whose degradation levels are less than the threshold value of the plurality of the blocks may be omitted, in operation S35. In other words, the memory controllers 100 and 100' may omit the operation of storing in the memory 150 the degradation information regarding the blocks whose degradation levels are less than the threshold value.

FIG. 10 is a diagram showing an example of degradation information, according to the method of generating degradation information of FIG. 9.

Referring to FIG. 10, the degradation information stored in the memory 150 may include information regarding the degradation described in the number and the vector format of each of the plurality of blocks. The information regarding the degradation described in the vector format may include at least one of an on cell count, an off cell count, a P/E Cycle, a read count, retention time, operating temperature, and the number of error bits of the read data. Alternatively, the information regarding the degradation described in the vector format may include two or more on cell counts obtained by using the read levels different from one another or two or more off cell counts obtained by using the read levels different from one another. Although the information regarding the degradation is described in the vector format in illustrating and describing FIG. 10, it is to be understood that such method is given by way of example, not of limitation. Degradation information may be generated in other describing methods.

As described in FIG. 9, solely the degradation information regarding the blocks whose degradation levels are equal to or greater than the threshold value may be stored in the memory 150. Therefore, whereas the degradation information regarding the blocks BLK1 and BLKn whose degradation levels are equal to or greater than the threshold value may be stored, the degradation information regarding the block BLK2 whose degradation level is less than the threshold value may be empty.

Figure 11:
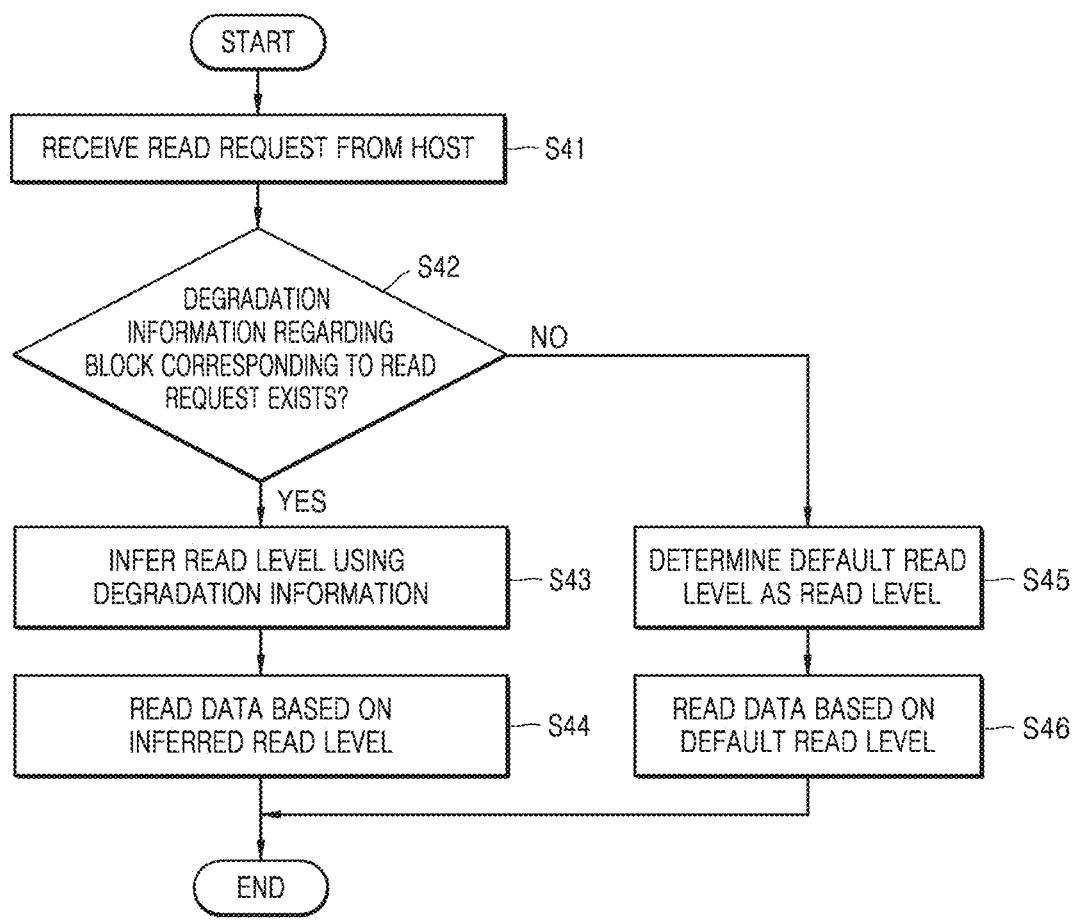
FIG. 11 is a flowchart illustrating a method of inferring a read level using the degradation information of FIG. 10.

FIG. 11 is a flowchart showing an example of a method of inferring a read level using the degradation information of FIG. 10.

Referring to FIG. 11, a read request may be received from a host, in operation S41. The memory controllers 100 and 100' may receive the read request and a logic address from the host through the host interface 120.

Verification may be made as to whether the degradation information regarding the block corresponding to the read request exists, in operation S42. In detail, the memory controllers 100 and 100' may obtain a physical address corresponding to the received logic address from the plurality of blocks of the memory device 200 and verify whether the degradation information regarding the block corresponding to the physical address of the plurality of blocks is stored in the memory 150. If the verified degradation information regarding the block is stored in the memory 150, the memory controllers 100 and 100' may execute operation S43. In contrast, if the verified degradation information regarding the block is not stored in the memory 150, the memory controllers 100 and 100' may execute operation S45.

A read level corresponding to the read request may be inferred using the verified degradation information regarding the block, in operation S43. Since the existence of the verified degradation information regarding the block refers to the fact that the verified degradation on the block occurs, the memory controllers 100 and 100' may perform a read level inferring operation. In detail, the memory controllers 100 and 100' provide the artificial intelligence model 110 with the verified degradation information regarding the block and may obtain the read level inferred from the artificial intelligence model 110. Data may be read using the inferred read level, in operation S44.

A default read level may be determined as the read level corresponding to the read request, in operation S45. Since the non-existence of the verified degradation information regarding the block refers to the fact that the verified degradation of the block occurs slightly or does not occur, the memory controllers 100 and 100' may determine the default read level as the read level corresponding to the read request. Data may be read using the default read level, in operation S46. The memory controllers 100 and 100' may transmit the information regarding the default read level to the memory device 200 through the command CMD and/or the control signal CTRL. The memory device 200 verifies the information regarding the inferred read level through the received command CMD and/or the control signal CTRL, thereby the memory device 200 may read the data using a read voltage corresponding to the inferred read level.

Consequently, the memory controllers 100 and 100' of FIGS. 9 through 11 may reduce the storage capacity by selecting in advance the blocks on which read level inferring operations are needed, namely, the blocks in which degradation has occurred, and storing solely the degradation information regarding those blocks.

Figure 12:
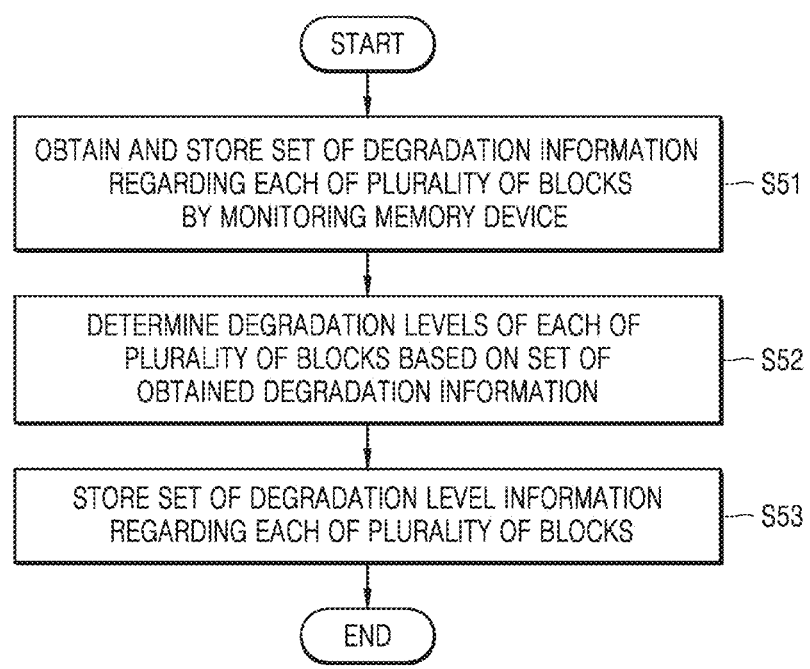
FIG. 12 is a flowchart illustrating a method of generating degradation information and degradation level information, according to an embodiment of the inventive concepts.

FIG. 12 is a flowchart illustrating a method of generating degradation information and degradation level information, according to an embodiment of the inventive concepts.

Referring to FIG. 12, the method of generating degradation information and degradation level information according to the present embodiment is the one executed by a background read operation. For example, the method of generating degradation information according to the present embodiment may be executed in the memory system 10 including the memory controller 100 of FIG. 5 or in the memory system 10 including the memory controller 100' of FIG. 6. The aforementioned descriptions with reference to FIGS. 1 through 6 may be applied to the present embodiment.

Degradation information regarding each of the plurality of blocks may be collected by monitoring the memory device 200, in operation S51. The memory controllers 100 and 100' may perform a background read operation through the background read controller BRC when performing a background operation. In addition, following the background read operation, the memory controllers 100 and 100' may collect degradation information regarding each of the plurality of blocks and store the collected information in the memory 150. In other words, the memory controllers 100 and 100' may store the whole of the collected degradation information regarding each of the plurality of blocks.

Degradation levels of each of the plurality of blocks may be determined based on the collected degradation information, in operation S52. Detailed methods of determining degradation levels may be substantially identical with the aforementioned descriptions associated with FIG. 5. Thus, descriptions that are the same as those of FIG. 5 will be omitted hereinafter.

The memory 150 may store the determined degradation level information regarding each of the plurality of blocks, in operation S53. The memory system 10 may store the whole of the determined degradation level information regarding each of the plurality of blocks.

FIG. 13 is a diagram showing an example of degradation information and degradation level information, according to the method of generating degradation information and degradation level information of FIG. 12.

Referring to FIG. 13, the degradation information stored in the memory 150 may include information related to the degradation described in the number and vector format of each of the plurality of blocks, and the degradation level information may include degradation levels of each of the plurality of blocks.

The information related to the degradation described in the vector format may include at least one of an on cell count, an off cell count, a P/E Cycle, a read count, retention time, operating temperature, and the number of error bits of the read data. Additionally, the information regarding the degradation described in the vector format may include two or more on cell counts obtained by using the read levels different from one another, or two or more off cell counts obtained by using the read levels different from one another. On the other hand, the information regarding the degradation may be generated in a different format other than the vector one.

As mentioned in the description of FIG. 12, since the degradation information regarding the entire plurality of blocks may be stored in the memory 150 irrespective of the degradation levels the degradation information regarding the block BLK2 whose degradation level is less than the threshold value may also be stored in the memory 150.

The degradation information and the degradation level information are described as being generated concurrently in the description and illustration of FIG. 13. However, the degradation information and the degradation level information may be separately generated and stored in the implementation.

Figure 14:
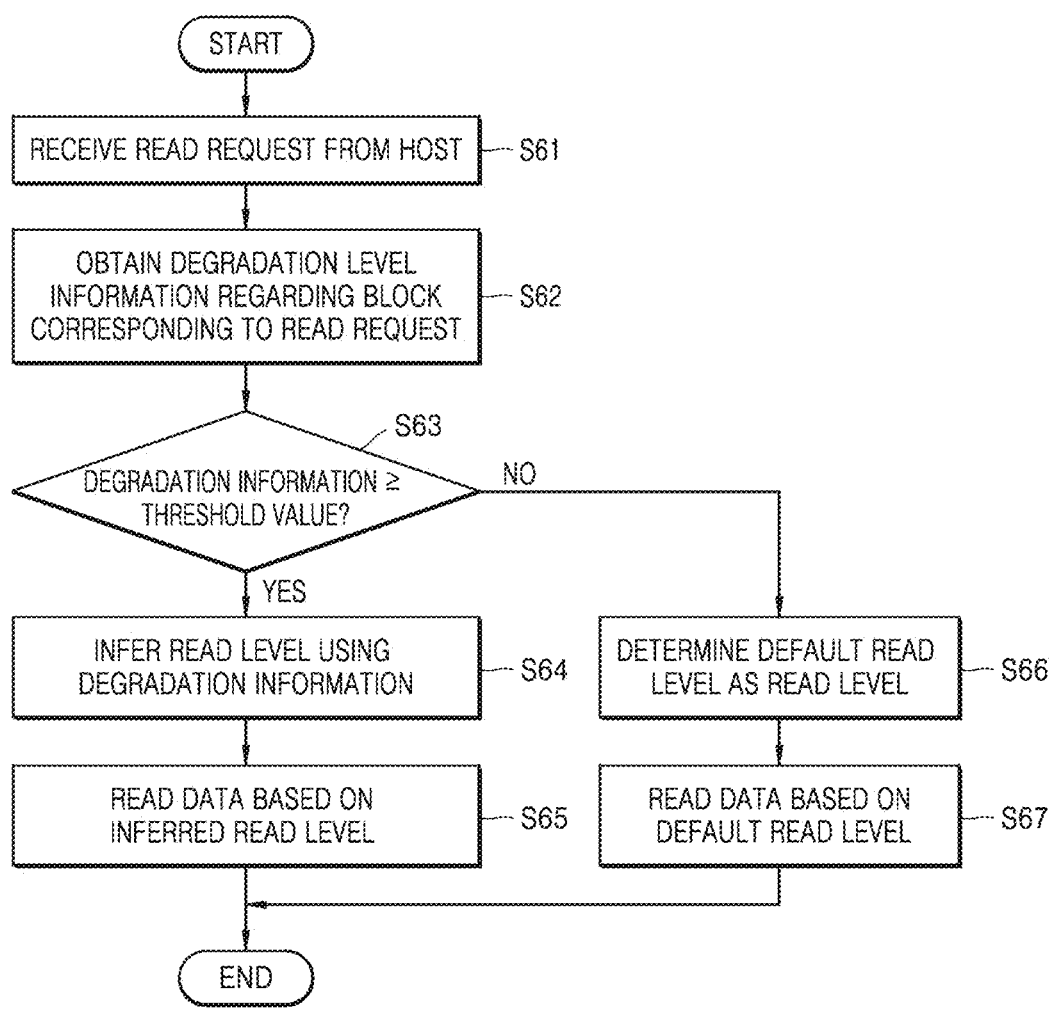
FIG. 14 is a flowchart showing an example of a method of inferring a read level using the degradation information and the degradation level information of FIG. 13.

FIG. 14 is a flowchart showing an example of a method of inferring a read level using the degradation information and the degradation level information of FIG. 13.

Referring to FIG. 14, a read request may be received from a host, in operation S61. The memory controllers 100 and 100' may receive the read request and a logic address from the host through the host interface 120.

Degradation level information regarding the block corresponding to the read request may be obtained, in operation S62. The memory controllers 100 and 100' obtain a physical address corresponding to the received logic address from the plurality of blocks of the memory device 200 and may obtain degradation level information regarding the block corresponding to the physical address of the plurality of blocks from the memory 150.

The degradation level of the block corresponding to the read request may be compared with a threshold value, in operation S63. In other words, the memory controllers 100 and 100' may compare the degradation level of the block corresponding to the read request with the preset threshold value. If the degradation level is equal to or greater than the threshold value, the memory controllers 100 and 100' may execute operation S64. In contrast, if the degradation level is less than the threshold value, the memory controllers 100 and 100' may execute operation S66.

A read level may be inferred using the degradation information regarding the block corresponding to the read request, in operation S64. In detail, the memory controllers 100 and 100' provide the artificial intelligence model 110 with the verified degradation information regarding the block and may obtain the read level inferred from the artificial intelligence model 110. Data may be read using the inferred read level, in operation S65.

A default read level may be determined as the read level corresponding to the read request, in operation S66. In other words, the memory controllers 100 and 100' may determine the default read level as the read level corresponding to the read request without inferring a read level. Data may be read using the default read level, in operation S67. The memory controllers 100 and 100' may transmit the information regarding the default read level to the memory device 200 through the command CMD and/or the control signal CTRL. The memory device 200 verifies the information regarding the inferred read level through the command CMD and/or the control signal CTRL, thereby the memory device 200 may read the data using a read voltage corresponding to the inferred read level.

According to the descriptions and illustrations of FIGS. 12 through 14, the memory controllers 100 and 100' generate degradation level information in advance and may determine whether to perform a read level inferring operation or not by verifying the already generated degradation level information when receiving the read request. Consequently, the time during which the memory is read in response to the read request may be reduced.

Figure 15:
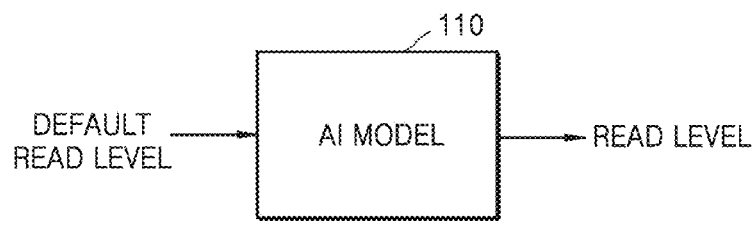
FIG. 15 is a diagram illustrating an artificial intelligence model, according to an embodiment of the inventive concepts.

FIG. 15 is a diagram illustrating an artificial intelligence model, according to an embodiment of the inventive concepts.

Referring to FIG. 15, the artificial intelligence model 110 infers a read level corresponding to a read request and may output the inferred read level by using degradation information regarding a block corresponding to the read request as an input data.

The input data of the artificial intelligence model 110 may consist of the various types of information included in the degradation information. For example, the input data of the artificial intelligence model 110 may be the on cell count referring to the number of memory cells that turned on when a default read level was applied to the block corresponding to the read request. Alternatively, depending on embodiments, the input data of the artificial intelligence model 110 may be first on cell count related to when a first read level was applied to the block corresponding to the read request and second on cell count related to when a second read level different from the first read level was applied to the block corresponding to the read request. However, examples of the input data of the artificial intelligence model 110 are not limited thereto. The artificial intelligence model 110 may be implemented with a combination of at least one or more of a P/E Cycle, a read count, retention time, operating temperature, the number of error bits of the read data, and the like. The artificial intelligence model 110 may further infer other operation conditions (for example, a program level, an erase level, and the like) depending on embodiments.

Moreover, the artificial intelligence model 110 may be trained on the basis that the degradation information regarding the blocks serves as its input data and the information regarding the read level generating no read errors serves as its output data. Furthermore, the artificial intelligence model 110 may be trained in advance by its fabricator and included when the memory system 10 is fabricated. In other words, the artificial intelligence model 110, which is trained on the basis of the degradation information collected by its fabricator from a plurality of memory systems and the information regarding the read level generating no read errors, may be included when the memory system 10 is fabricated. However, embodiments of the inventive concepts are not limited thereto. Depending on embodiments, the artificial intelligence model 110 may train or update itself on the basis that the degradation information collected by the memory system 10 during actual operations serves as its input data and the read level generating no read errors serves as its output data.

Alternatively, the artificial intelligence model 110 may be trained on the basis that the word line number of the block corresponding to the read request further serves as its input data in addition to the degradation information regarding the blocks. The artificial intelligence model 110 trained in such a manner may output the read level corresponding to the read request by using the word line number of the block corresponding to the read request received from the host HOST as its additional input data. Alternatively, the artificial intelligence model 110 may use various types of information in addition to the afore-described examples as its input data or output data.

Figure 16:
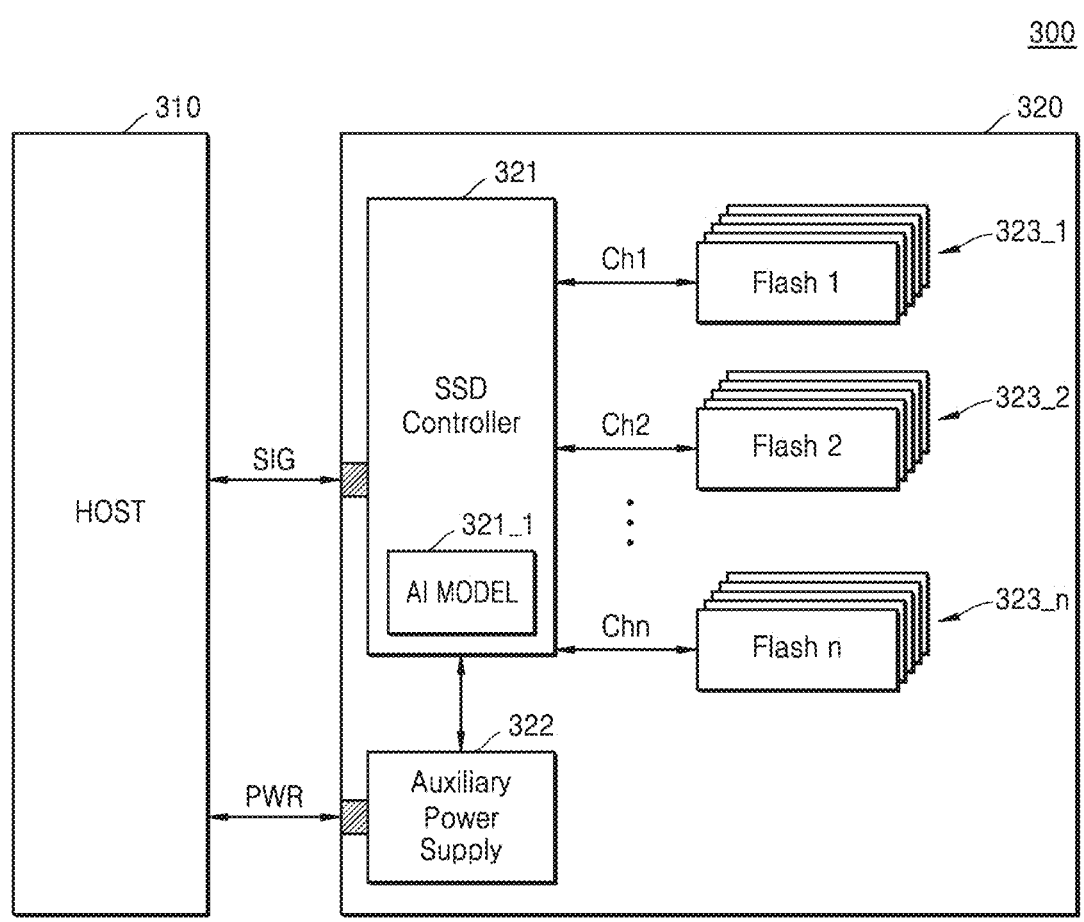
FIG. 16 is a block diagram illustrating a solid-state drive (SSD) system, according to an embodiment of the inventive concepts.

FIG. 16 is a block diagram illustrating a solid-state drive (SSD) system, according to an embodiment of the inventive concepts.

Referring to FIG. 16, an SSD system 300 may include a host 310 and an SSD 320. The SSD 320 exchanges signals with the host 310 through a signal connector and may receive power through a power connector. The SSD 320 may include a SSD controller 321, an auxiliary power supply 322, and memory devices 323_1 through 323_n. The SSD 320 may be implemented using the embodiments described above with reference to FIGS. 1 through 15. According to an embodiment of the inventive concepts, the SSD controller 321 may include an artificial intelligence model 321_1, and each of the memory devices 323_1 through 323_n may include a plurality of blocks.

The afore-described embodiments may be applied to the SSD system 300. When receiving a read request from the host 310, the SSD controller 321 may determine a degradation level of the block corresponding to the read request based on the degradation information regarding the block corresponding to the read request of the memory devices 323_1 through 323_n, infer a read level corresponding to the read request based on the determined degradation level, and read data from the memory devices 323_1 through 323_n, using the inferred read level.

If the read level is inferred using the degradation information according to the afore-described embodiment, the reliability of the read data may be increased, and performance may be improved by not incurring any overhead of operations involved in a read retry. Additionally, since the read level inferring operation is performed based on the degradation level of the block corresponding to the read request, the overhead of calculating involved in an inferring operation may be reduced while the reliability of the data is increased, and the frequency of read retries is lowered.

While the inventive concepts have been particularly shown and described with reference to embodiments thereof, it will be understood that various changes in form and details may be made therein without departing from the spirit and scope of the following claims.

What is claimed is:

1. A memory system comprising:
a memory device including at least one block;
a buffer configured to store degradation information regarding the at least one block; and
a memory controller configured to
when receiving a read request from a host, obtain the degradation information of a block corresponding to the read request from the buffer,
infer a read level for the block corresponding to the read request based on the obtained degradation information, and
read data from the memory device based on the read level.

2. The memory system of claim 1, wherein the memory controller is configured to:
determine a degradation level of the block corresponding to the read request based on the obtained degradation information;
read the data based on the inferred read level when the degradation level is equal to or greater than a threshold value; and
read the data based on a default read level when the degradation level is less than the threshold value.

3. The memory system of claim 1, wherein the memory controller is configured to:
include an artificial intelligence model trained to infer the read level; and
obtain the read level for the block corresponding to the read request by providing the artificial intelligence model with the obtained degradation information.

4. The memory system of claim 3, wherein the artificial intelligence model is based on at least one of an artificial neural network (ANN) model, a multi-layer perceptrons (MLPs) model, a convolutional neural network (CNN) model, a decision tree model, a random forest model, an AdaBoost (adaptive boosting) model, a multiple regression analysis model, a logistic regression model, and a random sample consensus (RANSAC) model.

5. The memory system of claim 3, further comprising:
a hardware accelerator configured to implement the artificial intelligence model; and
the memory controller is configured to control the buffer to provide the hardware accelerator with the degradation information.

6. The memory system of claim 3, wherein
the memory controller comprises a processor including a tightly coupled memory (TCM) in which the artificial intelligence model is stored; and
the memory controller is configured to control the buffer to provide the TCM with the degradation information.

7. The memory system of claim 1, wherein
the degradation information includes at least one of an on cell count, a program/erase cycle (P/E Cycle), a read count, and retention time of the at least one block.

8. A memory system comprising:
a memory device including a plurality of blocks;
a buffer storing degradation information regarding at least one block of the plurality of blocks; and
a memory controller configured to read data from the memory device, in response to a read request from a host;
wherein the memory controller comprises
a hardware accelerator configured to execute an artificial intelligence model trained to infer read levels; and
a processor configured to
control the buffer to provide the hardware accelerator with degradation information regarding a block corresponding to the read request,
obtain, through the artificial intelligence model, a read level of the block corresponding to the read request, and
read the data based on the obtained read level.

9. The memory system of claim 8, wherein the processor is configured to read the data based on a default read level when the degradation information regarding the block corresponding to the read request does not exist.

10. The memory system of claim 8, wherein the processor is configured to
collect the degradation information regarding each of the plurality of blocks by monitoring the memory system,
determine a degradation level of each of the plurality of blocks based on the collected degradation information regarding each of the plurality of blocks, and
store at least the degradation information for a block among the collected degradation information regarding each of the plurality of blocks based on the read level of each of the plurality of blocks.

11. The memory system of claim 10, wherein the processor is configured to
store the degradation information of a block having a degradation level that is equal to or greater than a threshold value among the collected degradation information regarding each of the plurality of blocks, and
omit storing the degradation information of a block having a degradation level that is less than the threshold value among the collected degradation information regarding each of the plurality of blocks.

12. The memory system of claim 10, wherein the processor is configured to collect the degradation information regarding each of the plurality of blocks by monitoring the memory device at a preset cycle.

13. A method of operating a memory system including a memory device including a plurality of blocks comprising:
   receiving a read request from a host;
   obtaining degradation information regarding a block among the plurality of blocks corresponding to the read request;
   inferring a read level for the block corresponding to the read request based on the degradation information; and
   reading data from the memory device based on the read level.

14. The method of claim 13, wherein the inferring of a read level comprises:
   providing an artificial intelligence model trained to infer the read level with the degradation information; and
   obtaining the read level for the block corresponding to the read request from the artificial intelligence model.

15. The method of claim 14, wherein the artificial intelligence model is based on at least one of an artificial neural network (ANN) model, a multi-layer perceptrons (MLPs) model, a convolutional neural network (CNN) model, a decision tree model, a random forest model, an AdaBoost model, a multiple regression analysis model, a logistic regression model, and a random sample consensus (RANSAC) model.

16. The method of claim 14, wherein the artificial intelligence model is implemented by a hardware accelerator included in the memory system.

17. The method of claim 13, wherein the degradation information includes at least one of an on cell count, a P/E Cycle, a read count, and retention time of the block.

18. The method of claim 13, further comprising:
   storing the degradation information regarding at least one of the plurality of blocks in a buffer included in the memory system,
   wherein the storing of the degradation information comprises
      collecting degradation information regarding each of the plurality of blocks by monitoring the memory device;
      determining a degradation level of each of the plurality of blocks based on the collected degradation information regarding each of the plurality of blocks; and
      storing at least the degradation information of a block among the collected degradation information regarding each of the plurality of blocks based on the degradation level of each of the plurality of blocks, and
   wherein the obtaining of the degradation information includes
      obtaining degradation information regarding a block corresponding to the read request from the degradation information stored in the buffer.

19. The method of claim 18, wherein the storing of at least one of the degradation information among the collected degradation information regarding each of the plurality of blocks includes storing degradation information of a block having a degradation level that is equal to or greater than a threshold value among the collected degradation information regarding each of the plurality of blocks.

* * * * *